United States Patent [19]

Tanaka et al.

[11] 3,941,672
[45] Mar. 2, 1976

[54] METHOD OF MANUFACTURING LIGHT SENSITIVE HETERODIODE

[75] Inventors: Yasuo Tanaka, Koganei; Hideaki Yamamoto, Kokubunji; Keiko Ooki, Tachikawa; Naohiro Goto, Machida; Toru Takigawa, Mobara, all of Japan

[73] Assignees: Hitachi, Ltd.; Nippon Hoso Kyokai, both of Japan

[22] Filed: Mar. 11, 1974

[21] Appl. No.: 450,186

[30] Foreign Application Priority Data
Mar. 12, 1973  Japan.................. 48-28022

[52] U.S. Cl. .............. 204/192; 29/572; 148/1.5; 357/6; 357/16; 357/30
[51] Int. Cl.² .............................. C23C 15/00
[58] Field of Search ........ 204/192; 156/17; 148/1.5; 29/572; 317/235 AC, 234 T; 357/6, 16, 30

[56] References Cited
UNITED STATES PATENTS

| 3,755,002 | 8/1973 | Hirai et al. ............... 317/235 AC |
| 3,770,606 | 11/1970 | Lepselter .................... 204/192 |
| 3,805,128 | 4/1974 | Scholl et al. .............. 317/234 T |

OTHER PUBLICATIONS

Kajiyama et al., "Electrical and Optical Properties of S₄O₂—Si Hetero-junctions," Japan J. Appl. Phys. b, (1967), 905–906.

Primary Examiner—Oscar R. Vertiz
Assistant Examiner—Wayne A. Langel
Attorney, Agent, or Firm—Craig & Antonelli

[57] ABSTRACT

A method of manufacturing a light sensitive heterodiode comprising an n-type transparent conductive layer and a p-type photoconductive layer provided thereon and forming rectifying contact therewith, in which before providing the p-type photoconductive layer on the n-type transparent conductive layer the surface of the latter is smoothed down by mechanical polishing or by bombarding it with ions accelerated by discharge.

20 Claims, 14 Drawing Figures

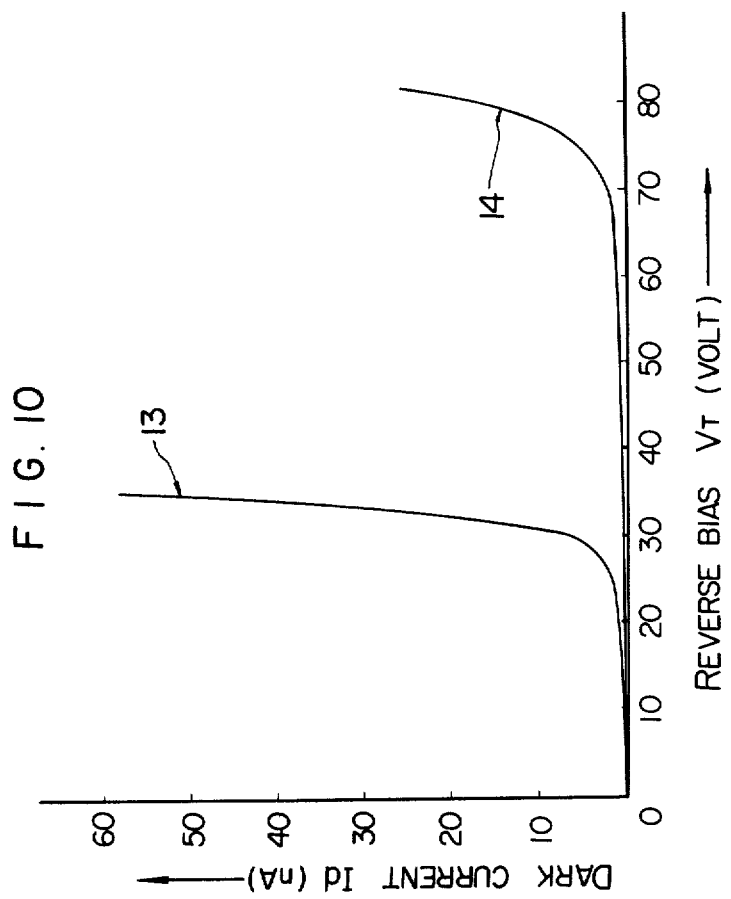

F I G. 12
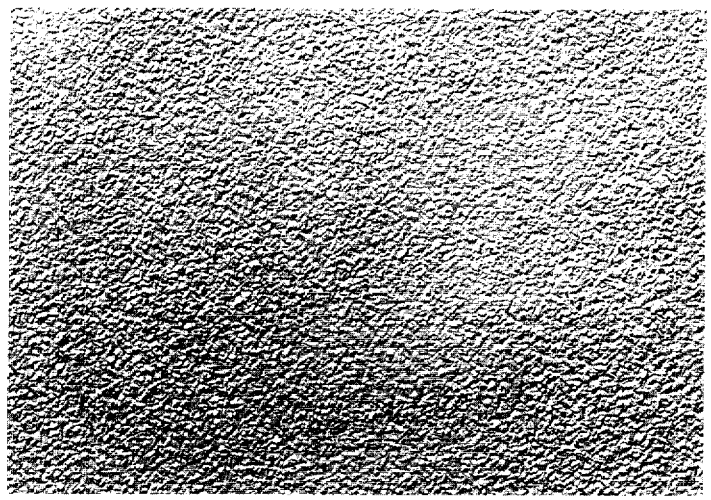
F I G. 14
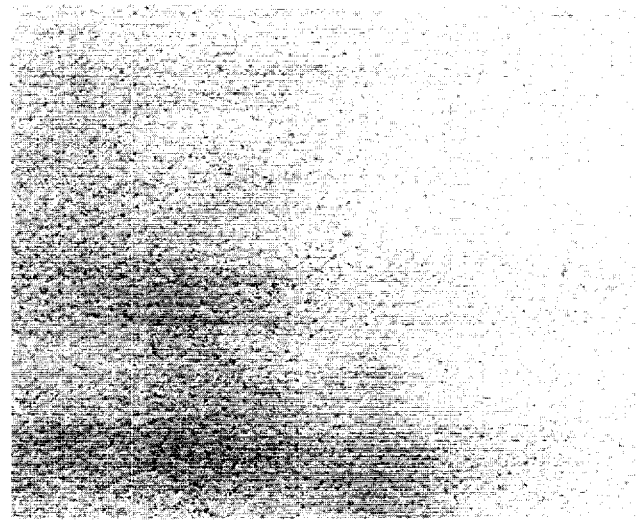

METHOD OF MANUFACTURING LIGHT SENSITIVE HETERODIODE

The present invention relates to a method of manufacturing a light sensitive element, and more particularly to a method of manufacturing an improved interface of the p-n junction of a photo-diode, a photoconductive cell, or a light sensitive element used as a target of a vidicon type image pick-up tube.

A light sensitive element is known in which an n-type oxide conductive layer extending on a transparent substrate and a p-type conductive layer provided on the n-type oxide conductive layer from a rectifying contact to which a voltage is applied in a reversely biassing manner. Also known is a light sensitive element in which an n-type conductive metal chalcogenide layer provided on an n-type transparent conductive metal oxide layer and a p-type conductive layer form a rectifying contact.

An advantage of these light sensitive elements is that the photo-response thereof is rapid and the dark current is low to improve the signal to noise ratio because the rectifying hetero-junction thereof is ordinarily backwardly biassed, and another advantage is that elements of a large area can be provided easily because they use ordinarily a poly-crystalline or amorphous material instead of a mono-crystal.

However, the backward breakdown voltage of such a hetero-junction diode is largely dependent upon the state of the interface between the n-type transparent conductive layer and the p-type conductive layer. It can be seen by observing with an electron microscope that the n-type transparent conductive layer prepared by, for example, a vacuum evaporation method, a chemical vapour deposition (CVD) method, or a pyrolytic decomposition method consists of a polycrystal having a gain size of the order of from several hundreds to several thousands of Angstroms and the surface thereof is considerably rough. If p-type conductive layers are formed directly on such n-type conductive layers with a constant composition and at a constant thickness, the range of the deviation of the threshold voltage for the breakdown of reverse biased heterojunction in the dark $V_B$ (hereinafter abreviated by backward breakdown voltage) is determined by the material of the n-type transparent conductive layer, the manufacturing method and the manufacturing condition. This fact is detrimental to the manufacture of the photosensitive element having a low dark current and a high backward breakdown voltage with a good reproducibility.

An object of the present invention is to provide a method of preparing a smooth interface of a p-n junction to improve the backward breakdown voltage and the reproducibility of a light sensitive teterojunction diode.

According to the present invention there is provided a method of manufacturing a light sensitive element comprising the steps of forming an n-type transparent conductive layer on a transparent substrate and forming a p-type photoconductive layer on the n-type transparent conductive layer to form a rectifying contact therewith, characterized in that it further comprises the step of smoothing the tips of microprotrusions of the surface of the n-type transparent conductive layer before the step of depositing the p-type photoconductive layer, and in that the p-type photoconductive layer is a layer of a material whose main component is a chalcogenide containing at least selenium.

Thus, the feature of the present invention is that the considerably rough surface of an n-type transparent conductive layer is smoothed down or the tips or extremities of sharp protrusions of the surface thereof are smoothed by mechanical polishing or bombardment by ions accelerated by discharge.

The n-type transparent conductive layer can be formed by depositing a substance selected from the group consisting of tin oxide, indium oxide, titanium oxide, tantalum oxide, thallium oxide, zinc oxide and mixtures thereof on a transparent substrate by a method of vacuum evaporation, CVD, pyrolytic decomposition, or rf sputtering. The thus deposited n-type transparent conductive layer may be further overlaid by an n-type conductivity chalcogenide layer of CdS, CdSe, ZnS, ZnSe or the like.

The photosensitive element fabricated by depositing a p-type chalcogenide containing selenium on the thus formed n-type conductive layer the surface of which is smoothed down according to the present invention is, when used in the backwardly biassed state, considerably improved in the backward breakdown voltage as compared with the conventional one which is not smoothed in the interface of the p-n junction.

The above and other objects, features and advantages of the present invention will become more apparent from the following detailed description of the preferred embodiments of the present invention made by way of example only and not for limitation when taken in conjunction with the accompanying drawings, in which:

FIG. 10 is a graph showing the effects of the interface state on the backward breakdown voltage of a junction of an n-type tin oxide conductive layer with a pure selenium film having a thickness of 1 micron;

FIG. 12 is an electron micrograph (x 20,000) of the surface of an n-type indium oxide conductive layer which is not smoothed down; and FIG. 14 is an electron micrograph (x 20,000) of the surface of a tin oxide layer deposited by rf sputtering.

EXAMPLE 1

Figure 1:
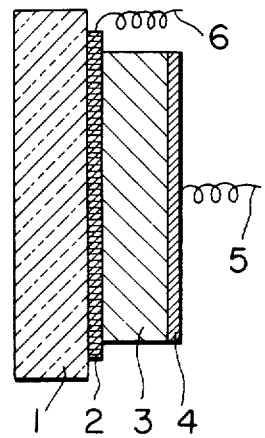
Figure 2:
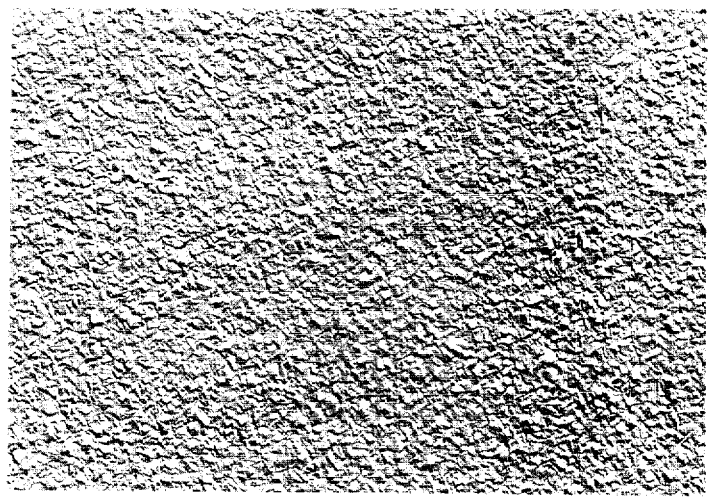
FIG. 2 is an electron micrograph (x 20,000) of the surface of an n-type tin oxide conductive layer which is not smoothed down.

Referring to FIG. 1, an n-type tin oxide transparent conductive layer 2 is deposited on a glass plate 1 to a thickness of about 2,000 Angstroms by pyrolytic decomposition of an alcohol solution of tin chloride. Observing with an electron microscope the surface of the deposited layer consists of polycrystals having grain sizes of about several hundreds to several thousands of Angstroms as shown in FIG. 2, each of the grains having vertices and edges. When a potential is applied to the deposited layer, electric fields concentrate at the vertices and edges, so that most current flows concentratedly through these parts. As a results, it is considered that the backward breakdown voltage is reduced. As a secondary effect, it is considered that the part around the extremities of the microcrystals changes in the quality due to the Joule heating, or, when an amorphous one is used as the chalcogenide, crystal nuclei are liable to be produced to give rise to paths of control.

If this surface is polished for about one hour by a lapping machine with alumina powder of a grain size of the order of from 500 to 1,000 Angstroms as an abrasive, the n-type conductive layer can be ground off by about 500 to 1,000 Angstroms. After having polished, the surface of n-type conductive layer is sufficiently subjected to ultrasonic washing, and then is sufficiently dried by being heated to 150°C.

Figure 3:
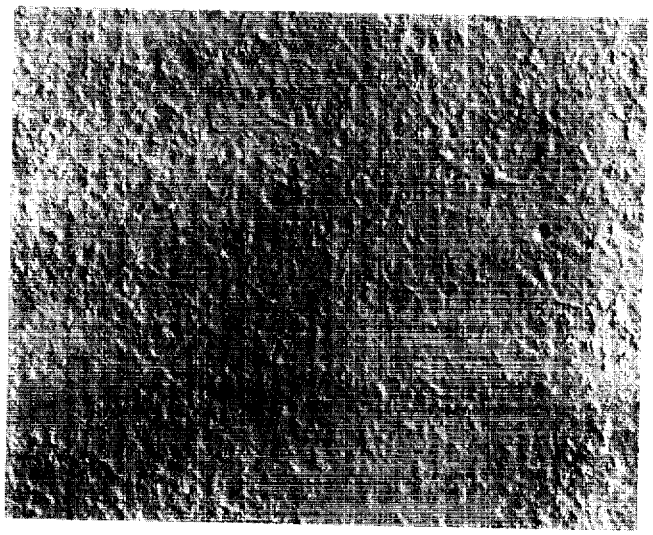
FIG. 3 is an electron micrograph of the surface of an n-type tin oxide conductive layer which is smoothed down by mechanical polishing.

An electron micrograph of the thus prepared surface is shown in FIG. 3. As can be seen from FIG. 3, the surface of the n-type oxide conductive layer is smoothed down. The state of the smoothing down can be observed in more stressed manner than the observation through an electron microscope by observing the state of secondary electron emission due to the electric field concentration through a scanning electron micrograph of the n-type conductive layer overlaid with a gold film of a thickness of about several hundreds of Angstroms as shown in FIGS. 4 and 5.

Figure 4:
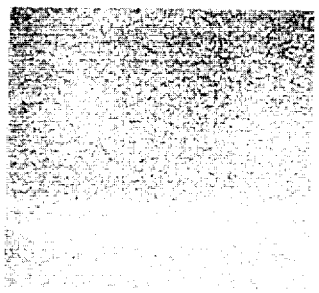
FIGS. 4 and 5 are scanning electron micrographs (x 6,000) of the surfaces of n-type conductive layers which are not smoothed down and smoothed down, respectively.

FIG. 4 is a scanning electron micrograph of the surface of the n-type conductive layer which is not smoothed down. The electric field is locally concentrated in each crystal grain.

Figure 5:
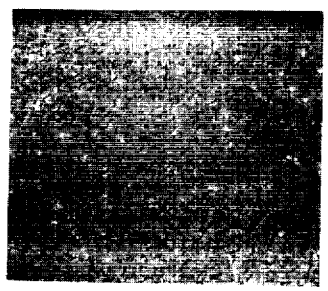

FIG. 5 is a scanning electron micrograph of the smoothed surface of the n-type conductive layer. The electric field is distributed considerably uniformly over the entire surface.

On the n-type oxide conductive layer 2 is deposited a layer 3 of a p-type photoconductive material such as selenium which forms a rectifying contact with the n-type conductive layer 2. A metal electrode 4 which forms an ohmic contact with the p-type photoconductive layer 3 is provided on the p-type photoconductive layer 3 to complete a light sensitive element. Reference numerals 5 and 6 designate lead wires for signal derivation.

Figure 6:
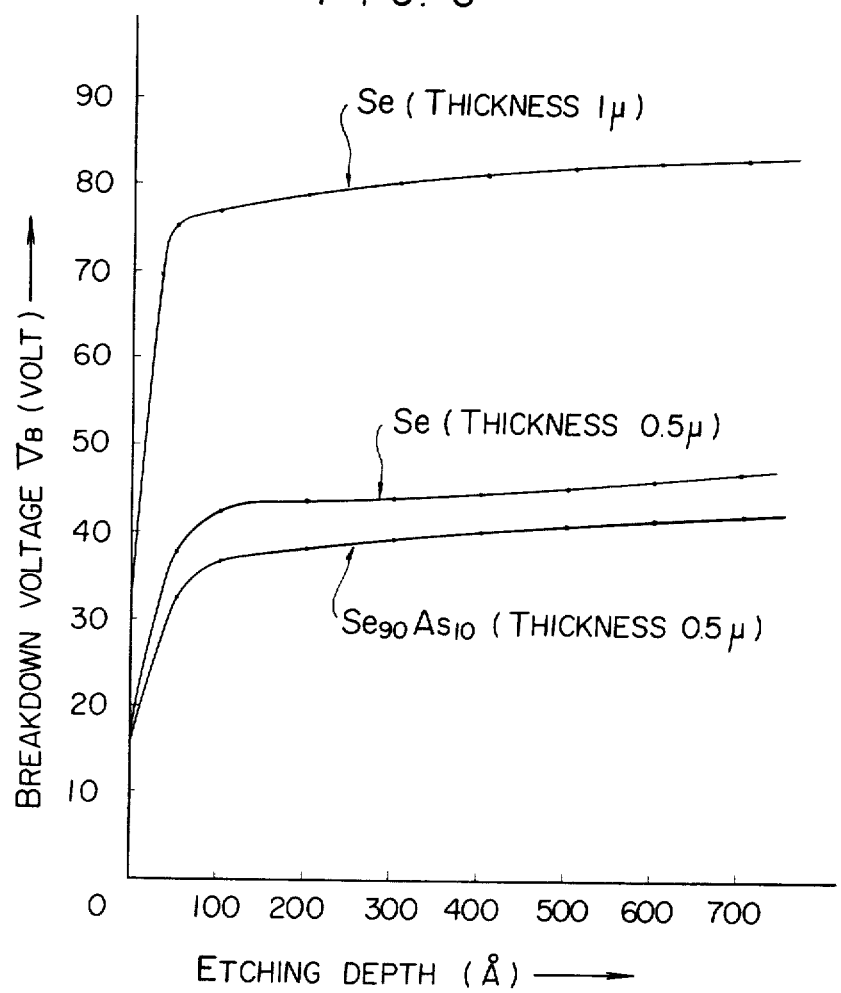
FIG. 6 is a graph of backward breakdown voltage versus etching depth characteristics.
Figure 7:
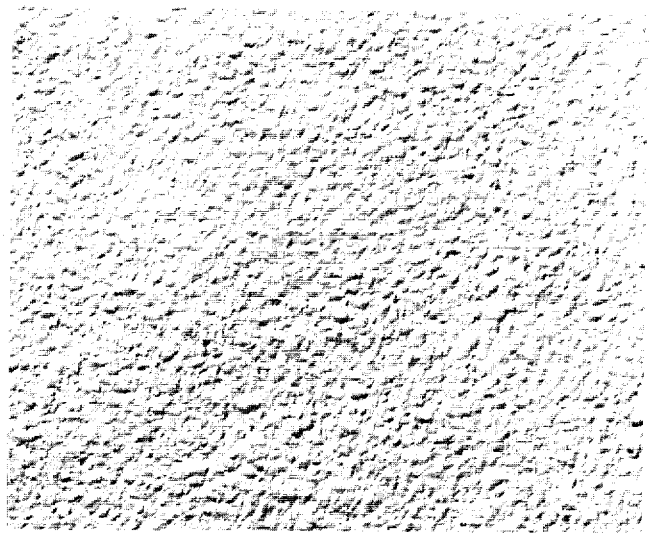
FIG. 7 is an electron micrograph (x 20,000) of the surface of an n-type tin oxide conductive layer which is smoothed down to a certain extent but in which grains of the polycrystal still remain.

FIG. 6 shows relations between the etching depth and the breakdown voltage. When the etching depth is about 100 Angstroms, the roughness owing to polycrystalline grains still remains. However, the sharp extremities of the crystal grains are dulled as seen from FIG. 7. The backward breakdown voltage of the n-type conductive layer having such a surface rises rapidly to around the backward breakdown voltage of the n-type conductive layer having the surface shown in FIG. 3.

However, to improve the life time and the reproducibility of the characteristics of the light sensitive element it is desirable to remove at least 30 percent of the thickness of the n-type conductive layer the protrusions of which have not yet been dulled. At this time, however, be careful not to remove the n-type conductive layer to such an extent that the conductivity of the n-type conductive layer is impared.

Though any polishing method and any abrasive may be utilized for the mechanical polishing of the n-type conductive layer so far as a smooth and clean surface without any protrusions can be prepared, a suspension in water of cerium oxide, aluminum oxide, chromium oxide, or silicon oxide having a grain size of about several hundreds to several thousands of Angstroms is utilized as the abrasive. When subjected to mechanical polishing, sometimes the rectifying contact happens to deteriorate due to the contamination of the surface as a result of the mechanical polishing. Accordingly, it is necessary for the surface, after polishing, to be subjected to ultrasonic washing to be cleaned and to be subjected to heating to be sufficiently dried.

EXAMPLE 2

The surface of the n-type conductive layer can be smoothed down by discharge instead of the mechanical polishing in Example 1.

Figure 8:
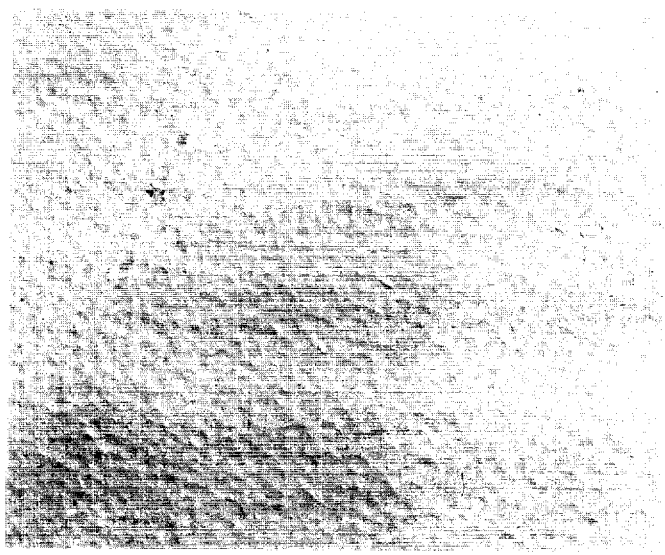
FIG. 8 is an electron micrograph (x 20,000) of the surface of an n-type tin oxide conductive layer which is smoothed down by rf plasma etching.

For surface treatment of the n-type conductive layer by discharge an rf triode sputtering apparatus of an rf diode sputtering apparatus, for example, is utilized. The transparent substrate provided with the n-type conductive layer is installed as the cathode (also called the target side electrode) of the rf sputtering apparatus and supplied with an rf high voltage between it and the opposite electrode (called the anode or the substrate side electrode) to produce a glow discharge in an inert gas. Inert gas ions produced by the discharge bombard the surface of the n-type conductive layer to etch it out. When observed with an electron microscope, the thus treated surface of the n-type conductive layer 2 is smoothed down as shown in FIG. 8. The inert gas means He, Ne, Ar, Kr or Xe. In this case, the plasma-etching is performed under the condition that the pressure of the inert gas is $1 \times 10^{-2}$ to $1 \times 10^{-1}$ Torr, and the accelerating voltage is about 0.5 to 3 KV.

When the dimension of the transparent substrate provided with the n-type conductive layer is smaller than that of the cathode of the rf sputtering apparatus, the metal composing the cathode is also plasma-etched to contaminate the surface of the n-type conductive layer. Hence, it is desirable to make the cathode of a material difficult to be etched or to cover the cathode with an insulating material. As the insulating material, for example, an insulating oxide, including $SiO_2$ or $Al_2O_3$, is utilized. The transparent substrate provided with the n-type conductive layer is placed on the covering insulator.

The photosensitive element made of the n-type conductive layer subjected to such a plasma-etching process and a p-type chalcogenide containing selenium with a rectifying contact therebetween can have the characteristics of a better reproducibility than that subjected to the mechanical polishing treatment in Example 1. It is understood that this is because the control of the etching of the n-type conductive layer is easy and the accuracy thereof is high, the flaw, unevenness, and contamination of the surface liable to produce when subjected to mechanical polishing are of a low degree, the depth of the mechanical strain produced by etching is slight.

EXAMPLE 3

Figure 9:
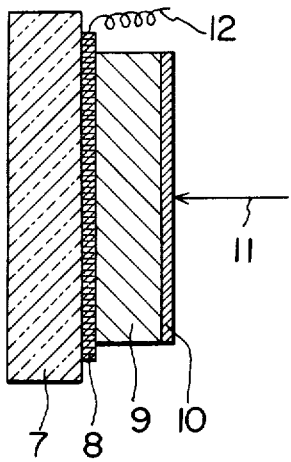
FIGS. 1, 9, 11 and 13 are cross-sectional views of photosensitive elements manufactured by the method of the present invention.

Removing the electrode 4 in FIG. 1, a light sensitive element of the type being scanned with an electron beam as shown in FIG. 9 can be formed. In FIG. 9 reference numeral 7 designates a glass substrate, reference numeral 12 designates a lead wire for signal derivation, and reference numeral 8 designates an n-type conductive layer the surface of which is smoothed down is in Example 1. A p-type amorphous semiconductor layer 9 of $Se_{90}Te_3As_7$ is evaporated on the n-type conductive layer 8 to a thickness of 5 microns in a vacuum of $3 \times 10^{-6}$ Torr. On the semiconductor layer 9 is evaporated a porous layer 10 of $Sb_2S_3$ to a thickness of about 1,000 Angstroms in an Ar atmosphere at about $5 \times 10^{-2}$ Torr to improve the landing of a scanning electron beam 11.

FIG. 10 shows relations between the dark current and the reverse biassing voltage of light sensitive elements of the type shown in FIG. 9 in which a pure selenium film of a thickness of 1 micron is used for the p-type conductive layer. This shows that the backward breakdown voltage depends mainly on the pattern of the electric field around the interface of the rectifying contact. The backward breakdown voltage is considerably improved by smoothing down the surface of the n-type conductive layer. In FIG. 10 the curve 13 is for the n-type conductive layer which is not smoothed down and the curve 14 is for the smoothed down n-type conductive layer.

EXAMPLE 4

Figure 11:
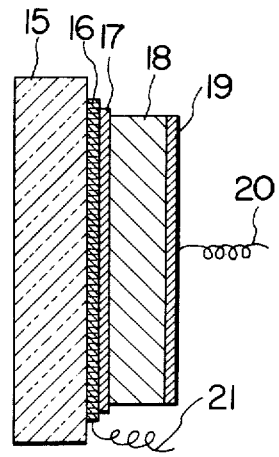

FIG. 11 is a light sensitive element similar to that of FIG. 1 except that an n-type chalcogenide conductive layer 17 is interposed between the n-type oxide conductive layer 16 and the p-type photoconductive layer 18 to improve the thermal and chemical stability of the rectifying contact. The current versus voltage characteristics of the element of FIG. 11 as a diode is substantially the same as that of the element of FIG. 1 so far as the thickness of the n-type chalcogenide conductive layer 17 is sufficiently small.

FIG. 12 is an electron micrograph of an n-type transparent conductive film of indium 16 having a thickness of about 1,500 Angstroms evaporated on a glass substrate 15 maintained at 200° to 300°C in an oxygen atmosphere at $5 \times 10^{-3}$ Torr. As can be seen from FIG. 12 the surface of the n-type conductive layer is considerably rough. This n-type conductive layer can be ground off by about 300 to 500 Angstroms by being subjected to mechanical polishing for about 20 minutes with cerium oxide abrasive of a grain size of about 200 to 800 Angstroms. The resulting n-type conductive layer 16 is sufficiently cleaned by ultrasonic washing in pure water and then sufficiently dried at 150°C. CdSe is evaporated on the thus treated n-type conductive layer 16 maintained at 200°C to a thickness of about 250 Angstroms in a vacuum of $5 \times 10^{-6}$ Torr to form an n-type conductive layer 17. This structure is fitted in an aluminium substrate holder provided on the cathode of an rf sputtering apparatus covering the cathode, an Ar gas atmospeher at $4 \times 10^{-2}$ Torr is established, and a voltage of 1 KV is applied between the opposite electrodes so that rf plasma-etching at 13.56 MHz is performed for 30 sec. to etch off the n-type conductive layer by about 100 Angstroms. Then, a p-type amorphous semiconductor layer 18 of $Se_{80}Ge_{10}Te_{10}$ is evaporated on the n-type conductive layer 17 to a thickness of 6 microns in a vacuum of $4 \times 10^{-6}$ Torr, and finally a gold electrode 19 is evaporated on the p-type semiconductor layer 18 to a thickness of about 1,000 Angstroms in a vacuum of $1 \times 10^{-6}$ Torr. Reference numerals 20 and 21 designate lead wires.

EXAMPLE 5

For the manufacture of the device of FIG. 9 described in Example 3 the smoothing by the rf plasme-etching described in Example 2 can be applied.

The n-type transparent conductive layer 8 is deposited on the glass substrate 7 by pyrolytic decomposition of an alcoholic solution of tin chloride to a thickness of about 1,500 Angstroms. The glass substrate 7 overlaid by the n-type conductive layer 8 is placed on a quartz glass glass plate covering the cathode of an rf sputtering apparatus, an Ar atmosphere at about $5 \times 10^{-2}$ Torr is established, and a voltage of 1 KV is applied between the opposite electrodes so that rf plasma-etching at 13.56 MHz is performed for 3 min. to etch off the n-type conductive layer by about 400 Angstroms. Then, a p-type amorphous semiconductor layer 9 of $Se_{90}As_5Te_5$ is evaporated on the n-type conductive layer 8 to a thickness of 5.5 microns in a vacuum of $3 \times 10^{-6}$ Torr, and finally, to improve the landing of an electron beam 11, a porous layer 10 of $As_2Se_3$ is evaporated on the p-type layer 9 to a thickness of about 1,500 Angstroms in an Ar atmosphere at $2 \times 10^{-2}$ Torr.

EXAMPLE 6

In some cases the polishing and etching of the n-type conductive layer 17 in Example 4 may be omitted.

A glass substrate 15 overlaid by an n-type transparent conductive layer 16 of $Tl_{60}Zn_{40}$ evaporated to a thickness of 2,000 Angstroms in an oxygen atmosphere at $1 \times 10^{-2}$ Torr is placed on the covered cathode for plasma-etching described in Example 2. By a discharge in a Kr gas atmosphere at about $3 \times 10^{-4}$ Torr a plasma is produced by another electrode for plasma generation which is coverged by a converging coil. By applying a voltage of 3 KV to the electrode for plasma-etching disposed perpendicularly to the converged plasma to perform rf plasma-etching for 10 min. the n-type conductive layer 16 is etched off by about 800 Angstroms. Then, an n-type conductive layer 17 of ZnSe is deposited on the n-type conductive layer 16 to a thickness of 100 Angstroms in a vacuum of $5 \times 10^{-6}$ Torr at 250°C. The thus prepared ZnSe film 17 is sufficiently smooth, even without being subjected to a smoothing process, due to the smoothness of the n-type conductive layer 16 because the ZnSe film 17 is very thin. At $6 \times 10^{-6}$ Torr alloys CdTe and $Se_{80}As_{20}$ are co-evaporated at a ratio 1:9 on the n-type conductive layer 17 to a thickness of 10 microns to form a p-type conductive layer 18. Finally, an electrode 19 of tellurium is evaporated on the p-type conductive layer 18 at $5 \times 10^{-6}$ Torr.

EXAMPLE 7

Figure 13:
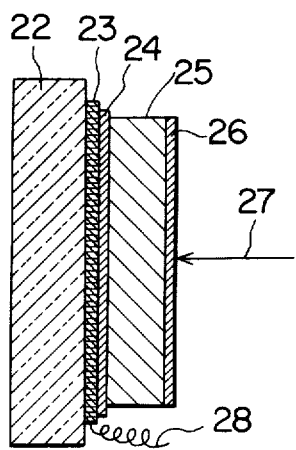

It is of course possible to form a light sensitive element of the electron beam scanning type by removing the electrode 19 in Example 6. In FIG. 13 reference numerals 22, 23 and 24 designate a glass plate, an n-type transparent oxide conductive layer and an n-type chalcogenide conductive layer, respectively. Similarly to the process described in Example 3 a p-type amorphous semiconductor layer 25 is deposited on the n-type conductive layer 24, and then, to improve the landing of a scanning electron beam 27, a porous layer 26 of $Sb_2S_3$ is evaporated on the p-type semiconductor layer 25 to a thickness of about 1,000 Angstroms in an Ar atmosphere at about $5 \times 10^{-2}$ Torr. Reference numeral 28 designates a lead wire for signal derivation.

The relation between this light sensitive element and that described in Example 3 and shown in FIG. 9 is all the same as the relation between the light sensitive elements shown in FIGS. 11 and 4, described in Example 4. That is, the thus manufactured light sensitive element is somewhat inferior to that of FIG. 1 in the strength of the rectifying contact at the initial characteristic (more definitely, the initial value of the backward breakdown voltage), but the thermal stability of the rectifying contact is improved. For example, the deterioration of the rectifying characteristic due to the crystallization of the p-type amorphous photoconductive layer at the interface of the contact hardly occurs. Furthermore, there is also a chemical change preventing effect. Consequently, the lifetime is prolonged and the reliability is high as a light sensitive element.

EXAMPLE 8

It is also possible to provide an n-type oxide conductive layer by rf sputtering.

A covering material of pyrex glass on the cathode of rf sputtering apparatus is painted with sufficiently ground stannic oxide, a glass plate is placed on the opposite electrode (anode), the inner space of the sputtering apparatus is filled with Ar gas at $6 \times 10^{-2}$ Torr, and a voltage of 2 KV is applied between the two electrodes to perform an rf sputtering at 13.56 MHz for 15 min. Then, an n-type tin oxide conductive layer about 2,000 Angstrom thick is formed on the glass plate. Though, a considerably smooth evaporated surface can be provided as shown in FIG. 14 by the rf sputtering, a more smoothed surface can be provided by being subjected to plasma-etching similarly to the process described in Example 5. A p-type amorphous semiconductor layer of $Se_{85}As_{10}Te_5$ is evaporated on the n-type conductive layer to a thickness of 4 microns in a vacuum of $3 \times 10^{-6}$ Torr. Then, to improve the landing of a scanning electron beam, a porous layer of $Sb_2S_3$ is evaporated on the p-type semiconductor layer to a thickness of about 1,000 Angstroms in an Ar atmosphere at $5 \times 10^{-2}$ Torr.

What we claim is:

1. A method of manufacturing a light sensitive element comprising forming an n-type transparent conductive layer on a transparent substrate, the surface of said n-type layer defining microprotrusions, and forming a p-type photoconductive layer on the n-type transparent conductive layer to form a rectifying contact therewith, said process characterized in that said n-type transparent layer is subjected to plasma etching to remove at least 100 A of said n-type transparent layer and thereby smooth said microprotrusions before the p-type photoconductive layer is deposited thereon and in that the p-type photoconductive layer is a layer of a material whose main component is a chalcogenide containing selenium.

2. A method of manufacturing a light sensitive element according to claim 1, wherein at least 30% of the thickness of the n-type conductive layer is removed during the plasma etching step.

3. A method of manufacturing a light sensitive element according to claim 2, characterized in that the n-type transparent conductive layer is made of a material whose main component is selected from the group consisting of indium oxide, titanium oxide, tantalum oxide, thallium oxide, zinc oxide, and mixtures thereof and on which there is deposited after the plasma etching step a thin layer of a material selected from the group consisting of CdS, CdSe, ZnS, ZnSe, and mixtures thereof.

4. A method of manufacturing a light sensitive element according to claim 3, wherein said thin layer of material defines microprotrusions, said process further comprising smoothing the tips of said microprotrusions of said thin layer by plasma etching or by mechanical polishing.

5. A method of manufacturing a light sensitive element according to claim 2, characterized in that the main component of the material of the n-type transparent conductive layer is selected from the group consisting of indium oxide, titanium oxide, tantalum oxide, thallium oxide, zinc oxide, and mixtures thereof.

6. A method of manufacturing a light sensitive element according to claim 2, characterized in that said p-type photoconductive layer is in an amorphous state.

7. A method of manufacturing a light sensitive element according to claim 2, wherein said n-type transparent conductive layer comprises a polycrystal having a grain size of the order of from several hundred to several thousand A, said n-type transparent conductive layer being formed by vacuum evaporation, chemical vapour deposition, pyrolytic decomposition of rf sputtering.

8. A method of manufacturing a light sensitive element according to claim 2, wherein plasma-etching is performed by means of an inert gas selected from the group consisting of He, Ne, Ar, Kr and Xe under a pressure of about $1 \times 10^{-2}$ to $1 \times 10^{-1}$ Torr and an accelerating voltage of about 0.5 to 3 KV.

9. A method of manufacturing a light sensitive element according to claim 2, wherein said n-type transparent conductive layer has a thickness of about 1500 to 2000 A prior to the plasma-etching step.

10. A method of manufacturing a light sensitive element according to claim 1, wherein said n-type conductive layer is formed by rf sputtering deposition.

11. A process for manufacturing a light sensitive element, comprising (a) forming an n-type transparent conductive layer on a transparent substrate by means of vacuum evaporation, chemical vapor deposition, pyrolytic decomposition or rf sputtering, said n-type transparent conductive layer being formed of a polycrystal having a grain size of the order of from several hundred to several thousand A and a microscopically rough surface defined by a plurality of microprotrusions, (b) subjecting said n-type layer to plasma etching to remove at least 100 A of said n-type layer and thereby smooth the surface of said n-type layer, and thereafter (c) coating said n-type transparent conductive layer with a p-type photoconductive layer of a material whose main component is chalcogenide containing selenium.

12. The process of claim 11, wherein said n-type transparent conductive layer is formed from at least one member selected from the group consisting of tin oxide, titanium oxide, indium oxide, tantalum oxide, thallium oxide, zinc oxide and mixtures thereof.

13. The process of claim 12 further comprising overlaying on the smoothed surface of said n-type transparent conductive layer an n-type conductivity chalcogenide layer.

14. The process of claim 13 further comprising smoothing the surface of the n-type conductivity chalcogenide layer before said p-type layer is applied thereto by plasma etching or mechanical polishing.

15. The process of claim 13, wherein said n-type conductivity chalcogenide layer is formed from at least one member selected from the group consisting of CdS, CdSe, ZnS and ZnSe.

16. The process of claim 12, wherein said p-type layer includes tellurium and arsenic.

17. The process of claim 11, wherein plasma-etching is performed by means of an inert gas selected from the group consisting of He, Ne, Ar, Kr and Xe under a pressure of about $1 \times 10^{-1}$ Torr and an accelerating voltage of about 0.5 to 3 KV.

18. The process of claim 11, wherein said n-type transparent conductive layer has a thickness of about 1500 to 2000 A prior to the plasma-etching.

19. The process of claim 11, wherein about 500 to 1000 A of said n-type layer is removed by plasma etching.

20. The process of claim 11, wherein said p-type layer includes tellurium and arsenic.

* * * * *